(12) United States Patent
Serizawa et al.

(10) Patent No.: US 6,583,990 B2
(45) Date of Patent: Jun. 24, 2003

(54) FLEXIBLE CIRCUIT BOARD AND CONNECT STRUCTURE THEREOF

(75) Inventors: Yasuyoshi Serizawa, Shizuoka-ken (JP); Takahiko Suzuki, Shizuoka-ken (JP); Keizo Nishitani, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/984,318

(22) Filed: Oct. 29, 2001

(65) Prior Publication Data

US 2002/0051345 A1 May 2, 2002

(30) Foreign Application Priority Data

Oct. 31, 2000 (JP) ........................................ 2000-333448

(51) Int. Cl.[7] ................................................ H05K 1/00
(52) U.S. Cl. ........................ 361/749; 361/774; 361/789; 174/260; 174/261

(58) Field of Search ................................. 361/749, 772, 361/774, 789, 720, 760, 752, 750, 751, 759; 174/254, 260, 261, 268, 117 FF; 439/77, 493, 67

(56) References Cited

U.S. PATENT DOCUMENTS

| 5,168,430 A | * 12/1992 | Nitsch et al. ................. 174/268 |
| 5,350,319 A | * 9/1994 | Roberts ...................... 439/325 |
| 5,356,308 A | * 10/1994 | Toba et al. .................. 439/422 |

* cited by examiner

Primary Examiner—David Martin
Assistant Examiner—Hung Bui
(74) Attorney, Agent, or Firm—Finnegan, Henderson, Farabow, Garrett, & Dunner, L.L.P.

(57) ABSTRACT

A flexible first circuit member (10) includes conductors (11) wired thereto. The conductors (11) include a first conductor group (12). The first circuit member defines an opening (14) having a first edge part (14d). The first conductor group (12) terminates at the first edge part (14d). A flexible second circuit member (13) is electrically connected to first conductor group (12) at the first edge part (14d).

11 Claims, 6 Drawing Sheets

FLEXIBLE CIRCUIT BOARD AND CONNECT STRUCTURE THEREOF

BACKGROUND OF THE INVENTION

The present invention relates to a connect structure of a flexible circuit board where a plurality of conductors wired to a flexible print circuit board are divided, being connected to a flexible circuit member.

For example, a door of an automobile is provided with various electric equipment such as a power window driving mechanism, a door mirror driving mechanism, a door lock mechanism, a speaker or the like. In order to perform electrical connection for the electric equipment, many harnesses are wired. In this case, as a method for simplifying the wiring of the harnesses, collective wiring is conducted using a flexible print circuit board (FPC) on which a plurality of conductors have been printed. The plurality of conductors on the flexible print circuit board are respectively divided at a portion of the board reaching each electric equipment. Each of the divided conductor groups is connected to a flexible circuit member for branching, and each flexible circuit member connected/branched is connected to target electric equipment. In this case, as the flexible circuit member to be connected to the flexible print circuit board, a flexible and flat lead wire is used.

SUMMARY OF THE INVENTION

An object of the invention is to provide a connect structure of a flexible circuit member where a plurality of flexible circuit members are easily drawn out from a flexible circuit board and where small-sizing of the flexible circuit board and overlapping arrangement of a plurality of flexible circuit members are allowed so that the simplification of fixing work of the flexible circuit members is achieved.

In view of a first aspect, the invention is directed to a flexible circuit board. The board includes a flexible base member having an enclosed opening with a first edge part. The circuit board includes a circuit wired to the base member. The circuit includes the first circuit part terminating at the first edge part for electrical connection.

Preferably, the base member has a second edge part away from the opening. The circuit includes a second circuit part terminating at the second edge part for electrical connection.

Preferably, the second circuit part extends alongside the first circuit part.

Preferably, the opening is configured in a rectangular shape.

Preferably, the opening has a recess from the first edge part, extending alongside the first circuit part.

In view of a second aspect of the invention, the invention is directed to a connect structure. The connect structure includes a flexible first circuit member including conductors wired thereto. The conductors include a first conductor group. The first circuit member defines an opening having a first edge part. The first conductor group terminates at the first edge part. The connect structure includes a flexible second circuit member electrically connected to first conductor group at the first edge part.

Preferably, the first circuit member has a second edge part. The conductors include a second conductor group terminating at the second edge. The connect structure includes a flexible third circuit member electrically connected to the second conductor group at the second edge part.

Preferably, the second and third circuit members are overlapped each other in a direction.

Preferably, the opening includes recesses from both ends of the first edge part, extending alongside the first conductor group.

BRIEF DESCRIPTION OF THE ACCOMPANYING DRAWINGS

These and other features, aspects, and advantage of the present invention will become better under stood with reference to the following description, appended claims, and accompanying drawings where:

DETAILED DESCRIPTION OF THE PREFERRED EMBODIMENTS

Embodiment of the present invention will be explained below with reference to the drawings.

Figure 1:
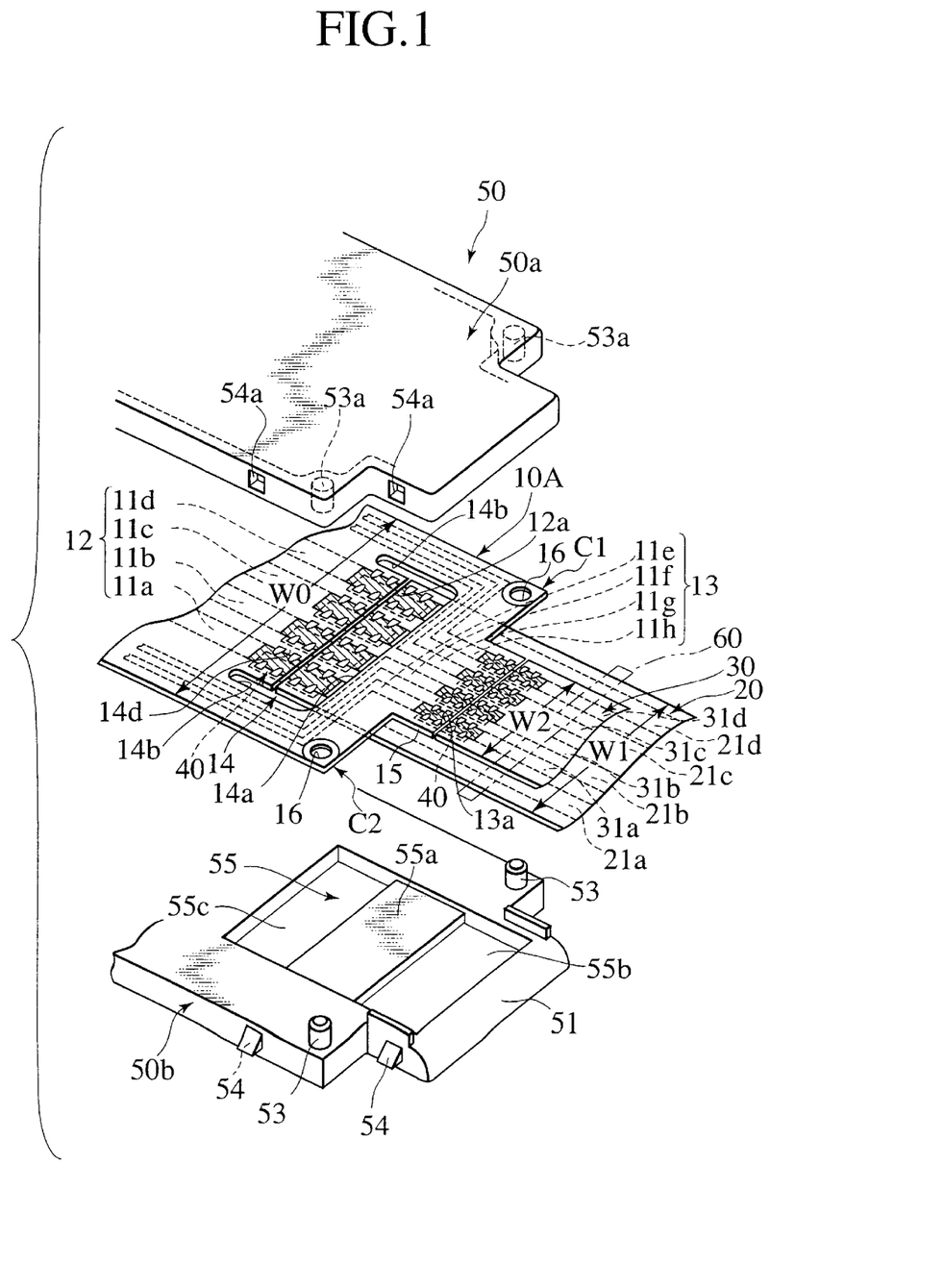
FIG. 1 is a perspective view showing a state before a flexible print circuit board and a flexible circuit member are accommodated in an electronic control unit, to which an interconnect structure of a flexible circuit member of a first embodiment of the present invention is applied.

As shown in FIG. 1, in a interconnect structure of a flexible circuit member according to this embodiment, as one example, a flexible print circuit board (FPC) 10A for a control board is connected with flat and flexible first and second lead wires 20 and 30 each serving as a flexible circuit member. This flexible print circuit board 10A is formed by bringing a conductive foil such as a copper foil in close contact with a surface of a base film, as known in general. The surface of the base film is covered with a cover film in an insulating manner. Using the conductive foil, a wiring pattern is printed in a desired shape by an etching process, a plating process or the like. On the other hand, the first and second lead wires 20 and 30 are respectively formed as flexible flat cables, where a conductive foil such as a copper foil is sandwiched in a base film using adhesive.

Figure 4:
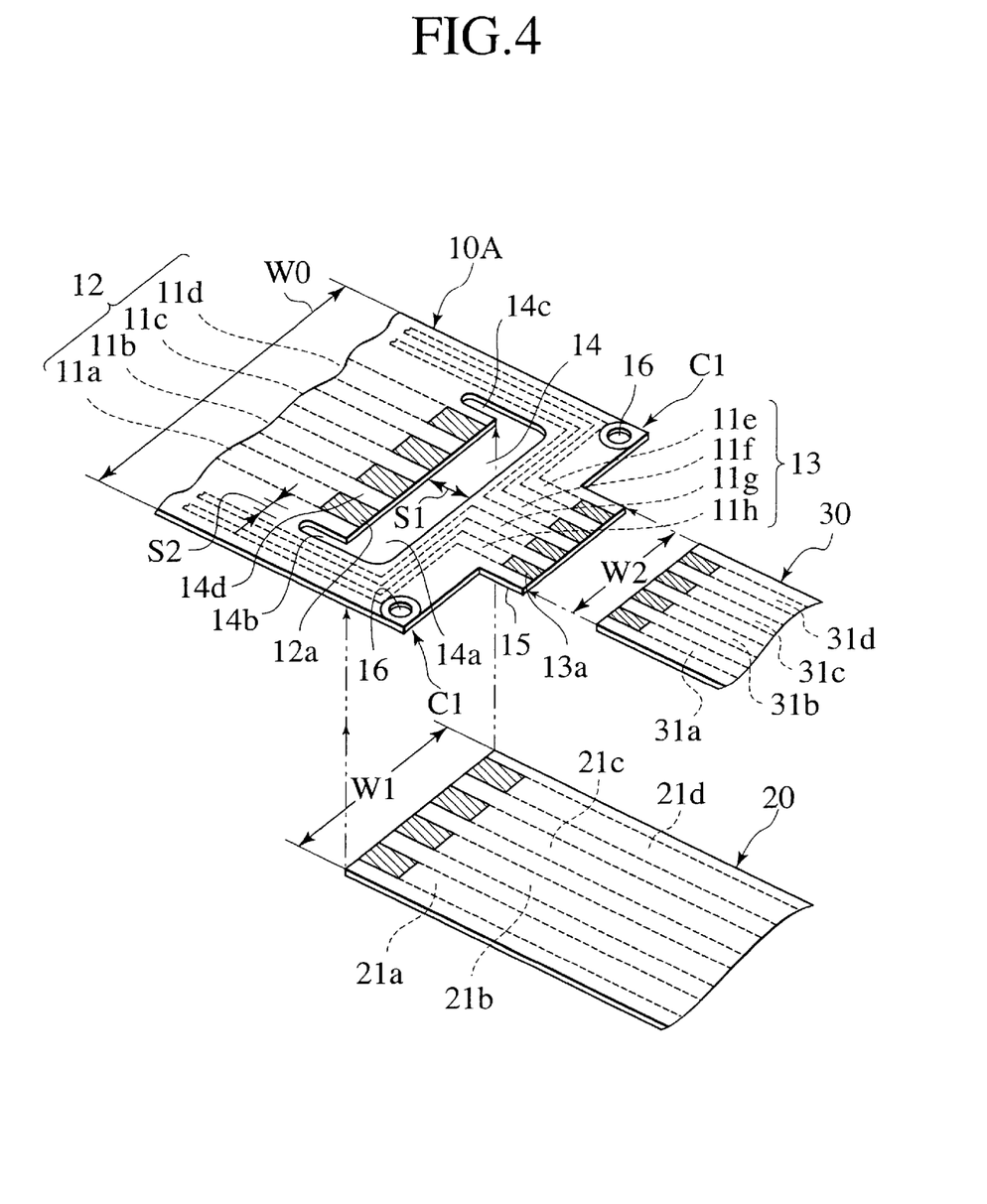
FIG. 4 is a perspective view showing a state before the board and the circuit member are connected to each other according to the first embodiment of the present invention.

As shown in FIG. 4, the board 10A is wholly formed in a rectangular shape having a width W0. The first and second lead wires 20 and 30 are respectively formed in strip shapes having widths W1 and W2 (W1>W2).

Also, a plurality of copper foils 11a to 11h serving as conductors are wired to the entire board 10A. Four copper foils 11a to 11d of these copper foils are arranged on a central portion. Two copper foils 11e and 11f and two copper foils 11g and 11h are respectively arranged on both side edge portions. Then, the copper foils 11a to 11d on the central portion are defined as a first conductor group (one of conductor groups), and the first lead wire (one of flexible circuit members) 12 is connected to the first conductor group 12. The copper foils 11e to 11h on both the side edge portions are defined as a second conductor group (the other of conductor groups) 13, and the second lead wire (the other of flexible circuit bodies) 30 is connected to the second conductor group 13.

As shown in FIG. 4, four copper foils 21a to 21d are arranged in first lead wire 20 so as to correspond to the copper foils 11a to 11d of the first conductor group 12. Four copper foils 31a to 31d are arranged in the second lead wire 30 so as to correspond to the copper foils 11e to 11h of the second conductor group 13.

Furthermore, as shown in FIG. 4, U-shaped cut-out in plan view is formed at a portion of the board 10A which is close to one end thereof. A terminal end 12a of the first conductor group 12 is defined at a formation part 14d, as a first edge part, of the U-shaped cut-out 14 in plan view. The first lead wire 20, as a second circuit member, is connected to the terminal end 12a. Also, a tongue (end) 15, as a second edge part, is formed integrally at a central portion of one end of the flexible print circuit board 10A. The second conductor group 13 is collected to this tongue 15 to define a terminal end 13a. The second lead wire 30, as a third circuit member, is connected to the terminal end 13a.

Figure 2:
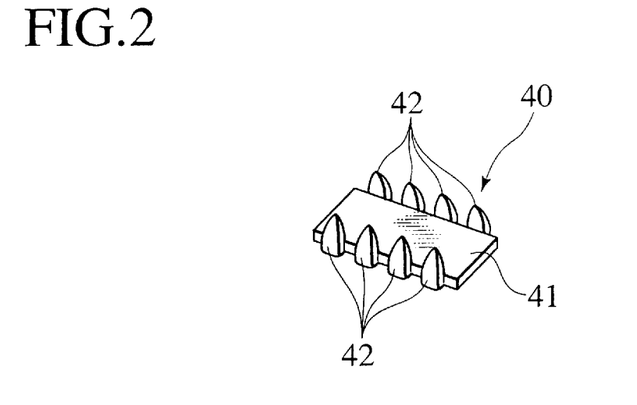
FIG. 2 is a perspective view of a connection fixture for the connection of a circuit member to the board according to the first embodiment of the present invention.

As shown in FIG. 1, when the copper foils 11a to 11d on the board 10A and the copper foils 21a to 21d of the first lead wire 20 corresponding thereto are mutually connected to each other, connection fixtures, each of which is so-called "piercing terminal" 40 shown in FIG. 2, are used. This piercing terminal 40 comprises a rectangular primary part 41 formed of such a conductor as a copper plate and a plurality of piercing claws 42 provided on both sides of the primary part perpendicularly thereto. Then, insulating films of connection ends on the copper foils 11a to 11d and the copper foils 21a to 21d are cut and removed (shown with oblique lines in Figure), and the copper foils of the connection ends are exposed in advance. Then, the piercing terminals 4 are arranged to extend over ends of one copper foils 11a to 11d and the other copper foils 21a to 21d to be connected. The piercing claws 42 are pierced into both side portions of the copper foils and the respective piercing claws 42 are caulked in opposing directions to each other. At this time, a case that the terminals 40 are fitted to the connection ends from back surfaces (back surface in Figure) thereof has been illustrated, but the present invention is not limited to this case. The terminals 40 may be fitted from a surface (surface in Figure) of the connection ends.

Also, the copper foils 11e to 11h on the flexible print board 10A and the copper foils 31a to 31d of the second wire 30 are mutually connected to each other. In this case, after insulating films of one copper foils 11e to 11h and the other copper foils 31a to 31d are cut and removed (shown with oblique lines in Figure) like the first lead wire, the terminals 40 are attached to extend over respective connection ends.

As shown in FIG. 4, the cut-out 14 is wholly formed in a U-shape in plan view. The cut-out 14 has a primary opening 14a formed so as to extend in a width (W0) of the flexible print board 10A. This cut-out 14 has recess openings 14b and 14c which are formed so as to be continuous from both ends of the primary opening 14a and which extend towards a side where the first conductor group 12 has been arranged perpendicularly to the primary opening. As shown in FIG. 4, the primary opening 14a is formed so as to have a relatively large gap or width (S1). Also, the recess opening 14b is formed so as to have a gap or width (S2) smaller than that of the primary opening 14a.

Then, in order to the first and second lead wires 20 and 30 to the flexible print board 10A, first, as shown in FIG. 4, in a state where the first lead wire 20 is disposed below the flexible print board 10A, the connection end of the first lead wire 20 is connected to the terminal end 12a of the first conductor group 12, using the terminals 40. Next, in a state where the connection end of the second conductor group 13 is caused to match with the tongue 15, the second lead wire 30 is connected to the terminal end 13a of the second conductor group 13, using the terminals 40. Thereby, as shown in FIG. 1, the first lead wire 20 and the second lead wire 30 are connected to the flexible print circuit board 10A such the former is positioned on an upper side and the later is positioned on a lower side. These first and second lead wires 20 and 30 are overlapped up and down in the same direction to be drawn out.

Thus, as shown in FIG. 1, the board 10A connected with the first and second lead wires 20 and 30 together with the connection ends of the first and second lead wires 20 and 30 is accommodated in an electronic control unit 50. This control unit 50 is provided with an upper casing 50a made of synthetic resin and a lower casing 50b made of synthetic resin. This unit 50 is wholly formed to conform to the board 10A, and it is formed at its one end with a drawing-out opening 51 for drawing out the first and second lead wires 20 and 30.

Figure 3:
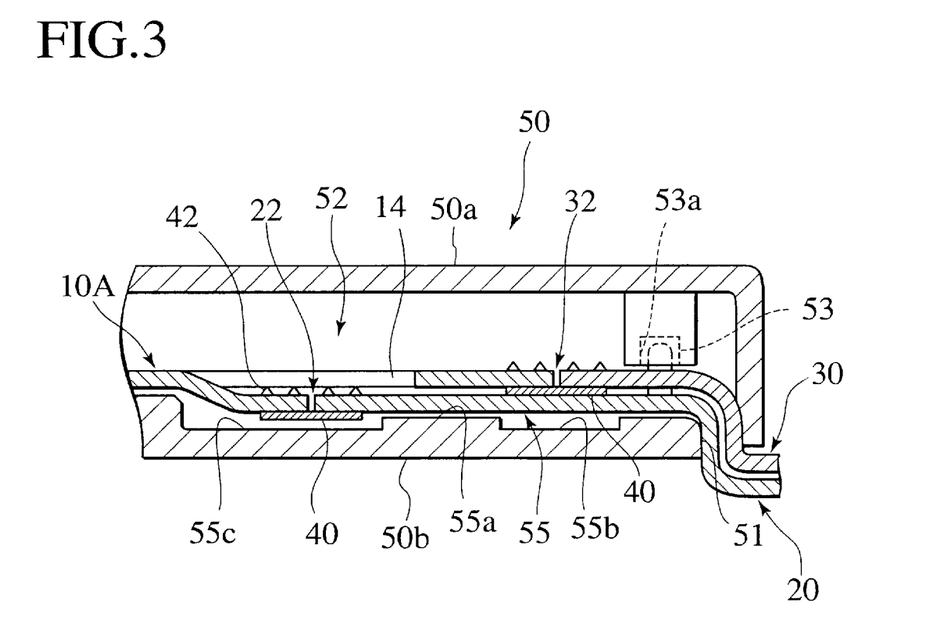
FIG. 3 is a sectional view of a state where the circuit member is connected to the board according to the first embodiment of the present invention.

As shown in FIG. 3, the upper casing 50a is put on the outer periphery of the lower casing 50b. An accommodating part 52 for accommodating the flexible print board 10A is formed between both the casings. When the upper casing 50a and the lower casing 50b are mated with each other, protrusions 53 protruded from the lower casing 50b are fitted into a fitting holes 53a of the upper casing 50a to be positioned. Furthermore, lock claws (engagement part) 54, protruded from side faces of the lower casing 50b, are engaged with lock holes (engagement part) 54a of the upper casing 50a so that the lower casing is prevented from falling off. At this time, the protrusions 53 are positioned at corners C1 and C2 on both sides of the end of the flexible print circuit board 10A. The protrusion 53 are inserted into insertion holes 16 formed in the corners C1 and C2 so that the board 10A is prevented from falling off against pulling force acting on the first and second lead wires 20 and 30.

Also, a receiving groove 55 for receiving the terminals 40 which have connected the first and second lead wires 20 and 30 to the board 10A is formed in the lower casing 50b. A front groove 55b and a rear groove 55c are formed in the this receiving groove 55 so as to sandwich a shallow shelf which has the same depth as the thickness of one of the first and second lead wires 20 and 30 and which is positioned at a central portion of the receiving groove 55. As shown in FIG. 1, in a case that the first lead wire 20 is arranged below the second lead wire 30, the piercing terminals 40 connecting this first lead 20 is received in the rear groove 55c. As described below, the front groove 55b receives the piercing terminals 40 connecting the second lead wire 30 when the second lead wire 30 is wired below the first lead wire 20.

As explained above, in the connection structure of a flexible circuit member according to the present embodiment, such a structure is employed that the first lead wire 20 is connected to the board 10A and the second lead wire 30 is connected to the board 10A. That is, the cut-out 14 formed in an intermediate portion to the board 10A serves as the terminal end 12a of the first conductor group 12, so that this terminal end 12a is connected with the first lead wire 20. Accordingly, the first lead wire 20 connected to the first conductor group 12 is drawn out as if it is branched from the intermediate portion of the board 10A in a direction of the thickness thereof. Furthermore, the second lead wire 30 connected to the second conductor group 13 is drawn out as if it is branched from one end of the board 10A in a direction of extension of the board. Accordingly, it becomes possible to draw out the first lead wire 20 and the second lead wire 30 in such a manner as overlapping up and down in the same direction. These lead wires 20 and 30 can be prevented from being positioned side by side in a conventional manner.

Accordingly, even in a case that the width (W1+W2) of the first lead wire 20 plus the second lead wire 30 is larger than the width W0 of the board 10A, the total width of the first and second lead wires 20 and 30 to be drawn out from the flexible print board 10A is not the summed width of the respective widths W1 and W2 of the first and second lead wires 20 and 30, but it becomes a wider one of the first and second lead wires. Namely the width W1 of the first lead wire 20 becomes the width for drawing-out in this embodiment. For this reason, a down-sizing is achieved by reducing the width W0 of the board 10A. Restriction on the widths of the first and second lead wires 20 and 30 is relaxed largely, and the degree of freedom for wiring or circuit design is expanded.

Also, the first and second lead wires 20 and 30 are drawn out in a manner overlapping up and down in the same direction, so that the lead wires 20 and 30 protruding from the control unit 50, respectively, can be collectively fixed by fixing means 60 such as a tape, a clip or the like, thereby facilitating a fixing work at that time.

Furthermore, since the cut-out 14 is wholly formed in a U shape in plan view by the primary opening 14a and the recess openings 14b, the terminal end 12a of the first conductor group 12 can be bent freely in the direction of the thickness of the board 10A through the recess openings 14b. Therefore, when the first lead wire 20 is connected to the first conductor group 12, the terminal end 12a can be pulled out from the board 10A in the connection direction, in the back surface direction in this embodiment, to be connected, so that the connecting work is easily and accurately performed.

Figure 5:
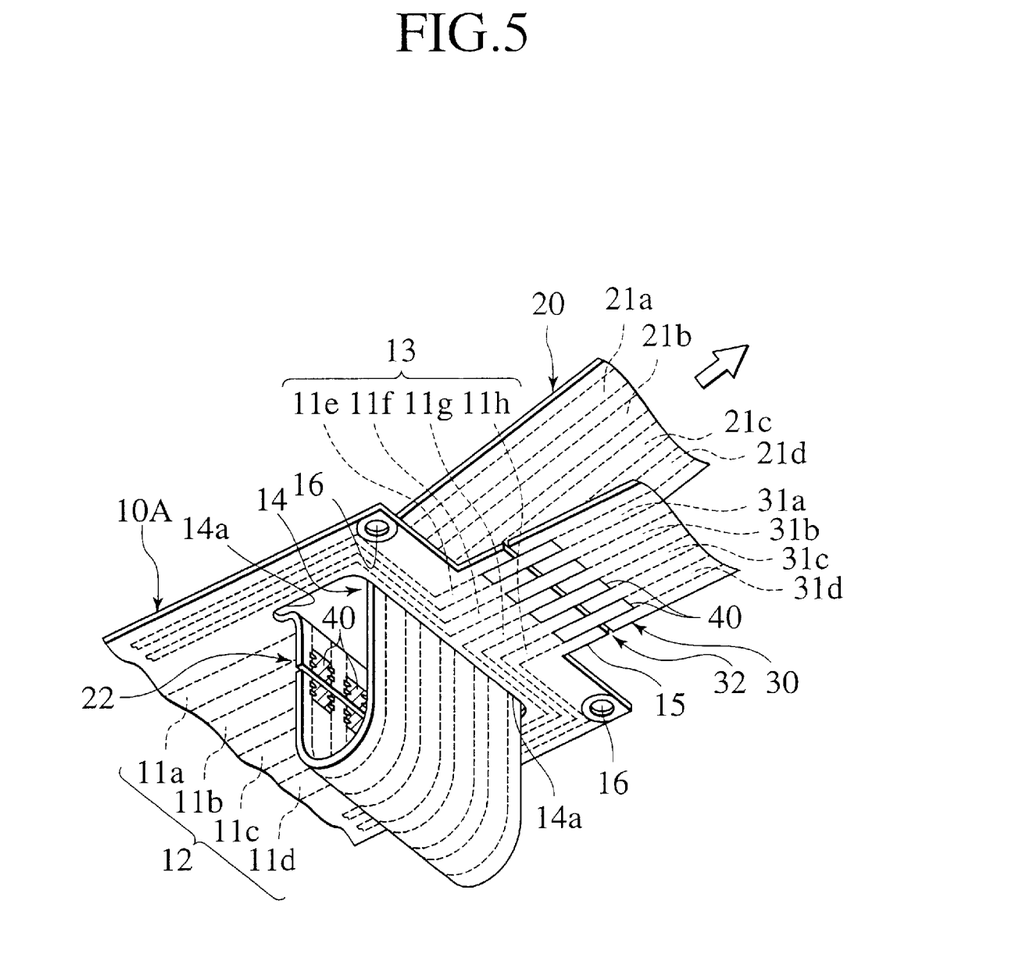
FIG. 5 is a perspective view of a state showing a midway where the flexible circuit member connected to the board is wired from a back surface of the board to a surface thereof according to the first embodiment.

In addition, the case that the first and second lead wires 20 and 30 connected to the board 10A are wired such that the first lead wire 20 is positioned below the second lead wire 30 has been illustrated. In the wired state, the lead wire 20 may be arranged on an upper side of the second lead wire 30 according to mounting position of electric equipment to be respectively connected. In this case, as shown in FIG. 5, while the first lead wire 20 is further being bent in a curved state, the tip end thereof is caused to pass through the generally U-shaped cut-out 14. Accordingly, when the first lead wire 20 is caused to pass through the board 10A from the back surface to the surface thereof (or from the surface to the back surface), the opening area of the cut-out 14 is enlarged through the recess openings 14b, so that wiring changing work is performed smoothly.

Figure 6:
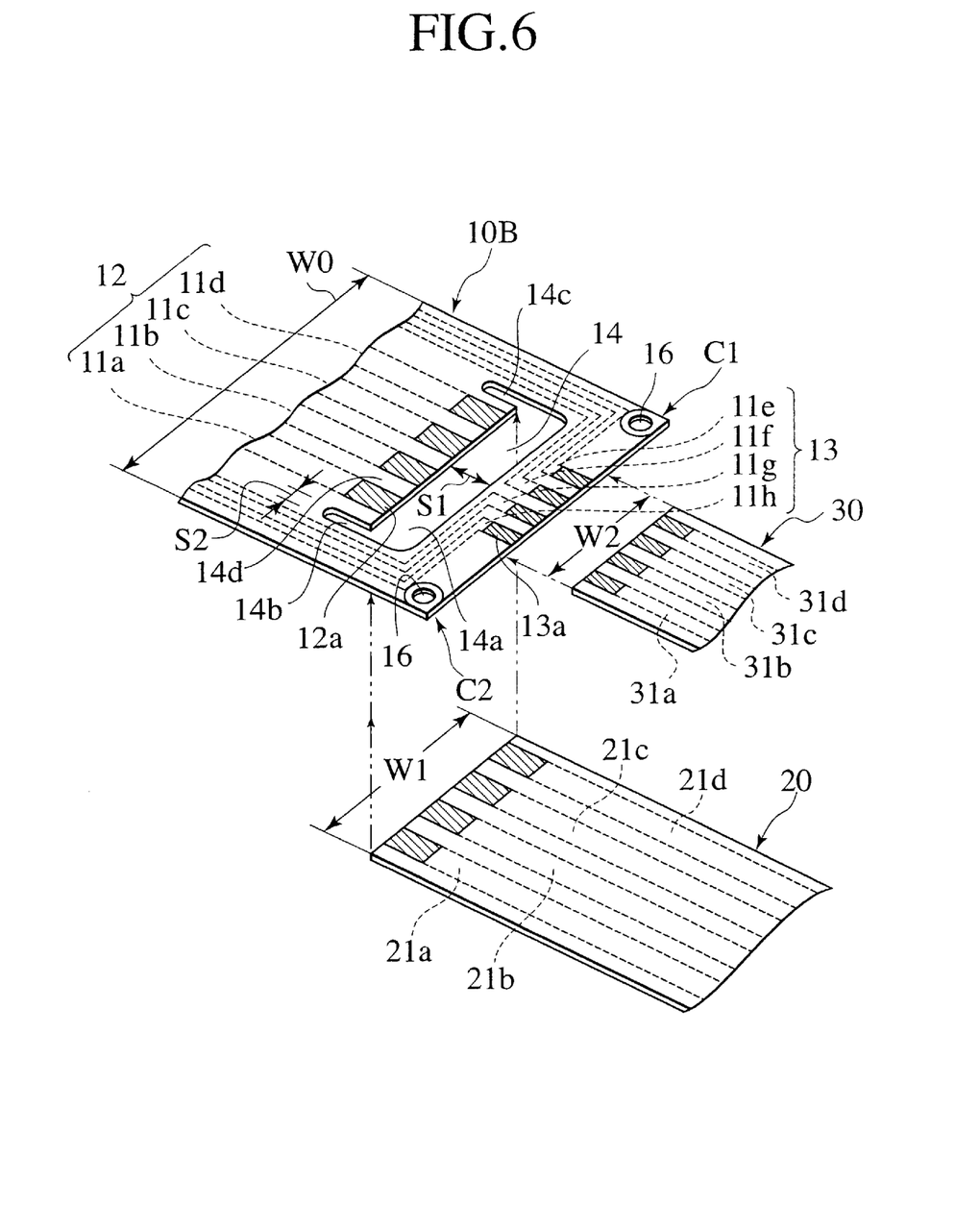
FIG. 6 is a perspective view showing a modified embodiment of the board according to the first embodiment of the present invention.

Incidentally, in the first embodiment, the case that one lead wire is connected to the cut-out side of the board has been shown. The present invention is not limited to this embodiment, but such a structure can be employed that a plurality of lead wires are connected to the cut-out side of the board. Also, as a modified embodiment of the first embodiment shown in FIG. 6, such a structure can be employed that a central connection part (the terminal end 13a of the second conductor group 13) of one end of a flexible print board 10B does not project.

Figure 7:
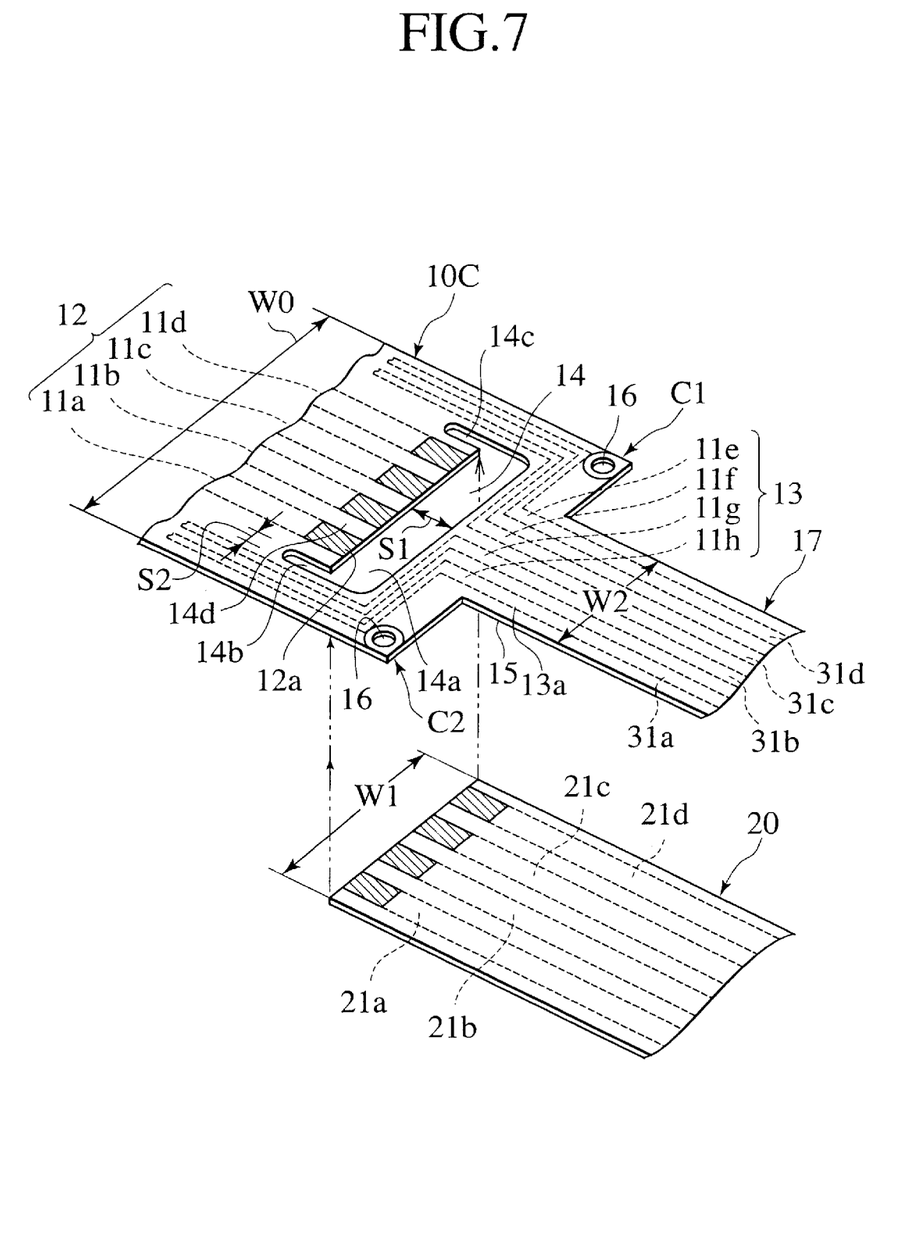
FIG. 7 is a perspective view showing a state before a board and a circuit member are connected to each other according to a second embodiment of the present invention.

FIG. 7 is a perspective view showing a state before a flexible print board 10C and the flexible circuit member 20 are connected to each other according to a second embodiment of the present invention.

This second embodiment is different from the first embodiment in that the terminal end (connection part) 13a of the second conductor group 13 is not provided at the central portion of one end of the board 10C and the second conductor group 13 extends continuously from a central portion of one end of the board 10C so that a flexible circuit member part 17 with a narrow width (W2) is formed integrally in a projecting manner.

Then, a cut-out 14 is formed at a predetermined portion of the board 10C. This embodiment is similar to the first embodiment regarding a point that a terminal end 12a of a first conductor group 12 is defined at the formation part 14d of the cut-out 14 and a flat and flexible first lead wire (flexible circuit member) 20 is connectable to this terminal end 12a. The first lead wire 20 is drawn out from the board 10C with a small width in such a manner that the flexible circuit member part 17 and the first lead wire 20 overlap each other. Thereby, the down-sizing of the board 10C can be achieved unlike the conventional art where a plurality of circuit members are arranged side by side at one end of the board 10C. The limitations on the first lead wire 20 and the circuit member part 17 is relaxed largely to expand the degree of freedom for wiring or circuit design.

As explained above, since it is unnecessary to arrange a plurality of flexible circuit members at an end of a flexible print board side by side in the conventional manner, a down-sizing of the board is achieved. The limitations on the widths of the circuit member and the circuit member part of the end side of the board are largely relaxed and the degree of freedom for wiring or circuit design is expanded.

A plurality of circuit members are drawn out from a board with a small width such that they overlap one anther. Thereby, it is unnecessary to arrange a plurality of circuit members at an end of a board side by side so that the down-sizing of the board can be achieved. By relaxing limitations on widths of respective circuit members, the degree of freedom for wiring or circuit design is expanded.

It becomes possible to fix a plurality of flexible circuit members collectively so that fixing work for them is easily and securely performed.

A terminal end of one of the conductor groups provided within the U-shaped cut-out is bent freely in a direction of the thickness of a board through an recess openings. Thereby, connection of one of the conductive groups and one of the circuit members is easily and accurately performed. Also, one of circuit members connected to one of conductor groups of a board is replaced to a surface side or a back surface side of the board up and down through the cut-out, so that wiring workability of circuit members is further improved.

The entire contents of Japanese Patent Applications P2000-333448 (filed Oct. 31, 2000) are incorporated herein by reference.

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

What is claimed is:

1. A flexible circuit board comprising:
    a flexible base member having an enclosed opening including a first edge along a portion of the opening and a third edge along another portion of the opening, the first edge and the third edge facing each other, the base member including a second edge away from the opening, the first and the second edges being on opposite sides of the third edge; and
    a circuit wired to the base member, the circuit including a first conductor terminating at the first edge for electrical connection, the circuit including a second conductor arranged side-by-side the first conductor, the second conductor extending beyond the opening, fully bypassing the opening, and terminating at the second edge for electrical connection.

2. The flexible circuit board according to claim 1, wherein the opening is configured in a rectangular shape.

3. The flexible circuit board according to claim 1,
    wherein the opening includes recess openings at both ends of the first edge, extending alongside the first conductor.

4. The flexible circuit board of claim 1, wherein the second conductor extends along both sides of the opening in the base member.

5. The flexible circuit board of claim 1, wherein the base member includes a tongue end forming the second edge, and the second conductor terminates on the tongue end.

6. A connection structure comprising:
    a flexible first circuit member including conductors wired thereto, the conductors including a first conductor group, the first circuit member defining an opening having a first edge part, the first conductor group terminating at the first edge part, and wherein the first circuit member also includes a second edge part, and the conductors include a second conductor group terminating at the second edge part;
    a flexible second circuit member electrically connected to the first conductor group at the first edge part; and
    a flexible third circuit member electrically connected to the second conductor group at the second edge part.

7. The connection structure according to claim 6,
    wherein the second and third circuit members overlap each other.

8. The connection structure according to claim 6,
    wherein the opening includes recess openings at both ends of the first edge part, extending alongside the first conductor group.

9. A connection structure of circuit boards comprising:
    a flexible first circuit board including conductors wired thereto, the first circuit board having an opening forming a first edge along a portion of the opening, the first circuit board having a second edge away from the opening,
        wherein the conductors include a first conductor group terminating at the first edge, and
        wherein the conductors include a second conductor group arranged side-by-side the first conductor group to extend beyond the opening, terminating at the second edge;
    a flexible second circuit board electrically connected to the first conductor group at the first edge; and
    a flexible third circuit board electrically connected to the second conductor group at the second edge.

10. The connection structure according to claim 9,
    wherein the second and third circuit boards overlap each other.

11. The connection structure according to claim 9,
    wherein the opening includes recess openings formed at both ends of the first edge, extending alongside the first conductor group.

* * * * *